United States Patent
Darabi

(10) Patent No.: US 7,421,260 B2
(45) Date of Patent: Sep. 2, 2008

(54) METHOD AND SYSTEM FOR A SECOND ORDER INPUT INTERCEPT POINT (IIP2) CORRECTION

(75) Inventor: Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 531 days.

(21) Appl. No.: 10/976,977

(22) Filed: Oct. 29, 2004

(65) Prior Publication Data

US 2006/0094361 A1   May 4, 2006

(51) Int. Cl.
*G06F 3/033* (2006.01)

(52) U.S. Cl. .................. 455/130; 455/136; 455/317; 375/298

(58) Field of Classification Search ........... 455/130, 455/136, 317; 375/298
See application file for complete search history.

(56) References Cited

U.S. PATENT DOCUMENTS

2003/0174783 A1 * 9/2003 Rahman et al. ............ 375/298
2004/0229580 A1 * 11/2004 Chen ......................... 455/130

* cited by examiner

*Primary Examiner*—Nay Maung
*Assistant Examiner*—Richard Chan
(74) *Attorney, Agent, or Firm*—McAndrews, Held & Malloy, Ltd.

(57) ABSTRACT

In RF transceivers, a method and system for a second order input intercept point (IIP2) correction are provided. A DC offset sensor may detect DC offset voltages produced by blocker signals in "I" and "Q" signal component paths in an RF receiver. The DC offset sensor may generate control signals which may be utilized by a first and second injection circuits to generate DC offset currents that compensate for the DC offset voltages in the signal component paths. An injection circuit may utilize current drivers to generate binary weighted currents which may be added together to produce a DC offset current. The polarity of the DC offset current and the selection of which current drivers to use may be determined by the control signals. A calibration voltage may also be utilized to correct or adjust the gain in the injection circuit.

16 Claims, 7 Drawing Sheets

METHOD AND SYSTEM FOR A SECOND ORDER INPUT INTERCEPT POINT (IIP2) CORRECTION

CROSS-REFERENCE TO RELATED APPLICATIONS/INCORPORATION BY REFERENCE

This application is related to the following applications, each of which is incorporated herein by reference in its entirety for all purposes:

U.S. patent application Ser. No. 10/976,976 filed Oct. 29, 2004;
U.S. patent application Ser. No. 10/977,000 filed Oct. 29, 2004;
U.S. patent application Ser. No. 10/976,575 filed Oct. 29, 2004;
U.S. patent application Ser. No. 10/977,464 filed Oct. 29, 2004;
U.S. patent application Ser. No. 10/977,798 filed Oct. 29, 2004;
U.S. patent application Ser. No. 10/977,005 filed Oct. 29, 2004;
U.S. patent application Ser. No. 10/977,771 filed Oct. 29, 2004;
U.S. patent application Ser. No. 10/977,868 filed Oct. 29, 2004;
U.S. patent application Ser. No. 10/976,666 filed Oct. 29, 2004;
U.S. patent application Ser. No. 10/977,631 filed Oct. 29, 2004;
U.S. patent application Ser. No. 10/976,639 filed Oct. 29, 2004;
U.S. patent application Ser. No. 10/977,210 filed Oct. 29, 2004;
U.S. patent application Ser. No. 10/977,872 filed Oct. 29, 2004;
U.S. patent application Ser. No. 10/977,869 filed Oct. 29, 2004;
U.S. patent application Ser. No. 10/977,874 filed Oct. 29, 2004; and
U.S. patent application Ser. No. 10/976,996 filed Oct. 29, 2004;

FEDERALLY SPONSORED RESEARCH OR DEVELOPMENT

Not applicable.

MICROFICHE/COPYRIGHT REFERENCE

Not applicable.

FIELD OF THE INVENTION

Certain embodiments of the invention relate to the processing of radio signals in a radio frequency (RF) transceiver. More specifically, certain embodiments of the invention relate to a method and system for process, voltage, and temperature (PVT) measurement and calibration.

BACKGROUND OF THE INVENTION

Today, much of the development and design of radio receivers, transmitter, and/or transceiver systems has been driven by the great demand for devices for mobile wireless communication applications, especially handset devices. With the ever decreasing size of mobile handsets and an ever increasing demand for voice, data, and/or video processing capabilities, there is an growing need to develop radio receivers and transmitters that not only meet these challenging performance requirements, but that do so in smaller integrated circuit (IC) footprints, that is, at lower cost, and with greater power efficiency. One approach that aims at addressing these demands is the development of highly integrated receivers, transmitters, and/or transceivers in complementary metal oxide semiconductor (CMOS) technology to minimize the number of off-chip components.

As a result of these highly integrated systems, radio receivers, transmitters, and/or transceivers may comprise a large number of components and/or circuits which may be utilized for the processing signals. The design of optimal systems may require that these components and/or circuits operate within certain requirements or constraints for a wide range of operational conditions. For example, power amplifiers (PA) and/or low noise amplifiers (LNA) may be required to operate at an optimal gain level. However, this gain level may vary significantly based on operational conditions, such as temperature and/or voltage supplies, or based on manufacturing conditions, such as the non-uniformity in transistor parameters that result from normal variations in the manufacturing process. These variations, generally referred to a process, voltage, and temperature (PVT) variations, may have a significant effect in the overall performance of wireless handsets.

In systems based on the Global System for Mobile Communications (GSM) standard, for example, PVT variations in many of the circuits and/or components utilized in the receiver or the transmitter may produce errors in the generation of "I" (in-phase) and "Q" (quadrature) signal components. These errors may result in a significant degradation in the signal-to-noise ratio (SNR) and/or the bit-error-rate (BER) performance of GSM handsets.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for a second order input intercept point (IIP2) correction. Aspects of the method may comprise detecting a DC offset voltage. A plurality of current driver control signals may be generated based on the detected DC offset voltage. A plurality of weighted offset currents may be generated based on the generated current driver control signals and an input voltage. The weighted offset currents may be binary weighted, for example. The input voltage may be a differential signal. Moreover, a DC offset current may be generated to compensate for the detected DC offset voltage. The DC offset current may be based on the weighted offset currents. The DC offset current may be a differential signal. A first DC offset voltage may be detected in an "I" (in-phase) signal component path and a first DC offset current may be generated to compensate for the detected first DC offset voltage. A second DC offset voltage may be detected in a "Q" (quadrature) signal component path and a second DC offset current may be generated to compensate for the detected second DC offset voltage.

In another aspect of the method, the current driver control signals may comprise a polarity selection signal, a plurality of current driver selection signals, and a current bias signal. A number of current drivers to generate the weighted offset currents may be selected based on the current driver selection signals. A polarity for the weighted offset currents may be selected based on the polarity selection signal. A reference current may be generated based on the current bias signal. A positive polarity control signal may be generated in the current drivers by ANDing the polarity selection signal and a portion of the current driver selection signals that corresponds to each of the current drivers. A negative polarity control signal may be generated in the current drivers by inverting the polarity selection signal and ANDing the inverted polarity selection signal and a portion of the current driver selection signals that corresponds to each of the current drivers.

The method may comprise selecting a blocker signal as the input voltage. A calibration signal may also be selected as the input voltage. When the calibration signal is selected as the input voltage, a calibration DC offset current may be generated based on the calibration signal. The method may also comprise detecting a calibration DC offset voltage produced by the generated calibration DC offset current and storing the detected calibration DC offset voltage.

Aspects of the system may comprise a DC offset sensor that detects a DC offset voltage. The DC offset sensor may generates a plurality of current driver control signals based on the detected DC offset voltage. A circuit comprising a plurality of current drivers. The DC offset sensor may transfer the current driver control signals and an input voltage to the current drivers in the circuit. The input voltage may be a differential signal. The current drivers may generate a plurality of weighted offset currents in the circuit based on the transferred current driver control signals and input voltage. The weighted offset currents may be binary weighted, for example. The circuit may generate a DC offset current to compensate for the detected DC offset voltage. The DC offset current may be based on the weighted offset currents and may be a differential signal.

The current driver control signals generated by the DC offset sensor may comprise a polarity selection signal, a plurality of current driver selection signals, and a current bias signal. The circuit may select a number of current drivers to generate the DC offset current based on the current driver selection signals. The circuit may selects a polarity for the weighted offset currents in the current drivers based on the polarity selection signal. The current drivers may generate a reference current based on the current bias signal. The current drivers may generate a positive polarity control signal by ANDing the polarity selection signal and a portion of the current driver selection signals that corresponds to each of the current drivers. The current drivers may also generate a negative polarity control signal by inverting the polarity selection signal and ANDing the inverted polarity selection signal and a portion of the current driver selection signals that corresponds to each of the current drivers.

The circuit may select the input voltage by turning ON a first switch and a second switch and turning OFF a third switch and a fourth switch in the circuit and where the selected input voltage corresponds to a blocker signal. The circuit may also select the input voltage by turning ON a third switch and a fourth switch and turning OFF a first switch and a second switch in the circuit and where said selected input voltage corresponds to a calibration signal. The circuit may generate a calibration DC offset current based on the calibration signal. The DC offset sensor may detect a calibration DC offset voltage produced by the generated calibration DC offset current and may store the detected calibration DC offset voltage.

In another aspect of the system, the DC offset sensor may detects a first DC offset voltage in an "I" (in-phase) signal component path. A first circuit may generate a first DC offset current to compensate for the detected first DC offset voltage. The DC offset sensor may detect a second DC offset voltage in a "Q" (quadrature) signal component path. A second generates a second DC offset current to compensate for the detected second DC offset voltage. The first circuit and the second circuit may both be implementations of the circuit comprising the current drivers.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a second order input intercept point (IIP2) correction. By utilizing injection circuits in the signal components paths of an RF receiver, DC offset voltages resulting from second order nonlinearity effects on blocker signals may be corrected. The injection circuits may utilize information provided by a DC offset sensor to generate DC offset currents of the appropriate amplitude and polarity to correct the DC offset voltages. Moreover, the injection circuits may have the built-in capability to correct or adjust the gain in the injection circuits. This approach may provide a flexible and cost effective way to correct any signal saturation and/or noticeable degradation in an RF receiver's noise performance that may result from the DC offset voltages produced by the presence of interfering signals in the channel of interest.

Figure 1:
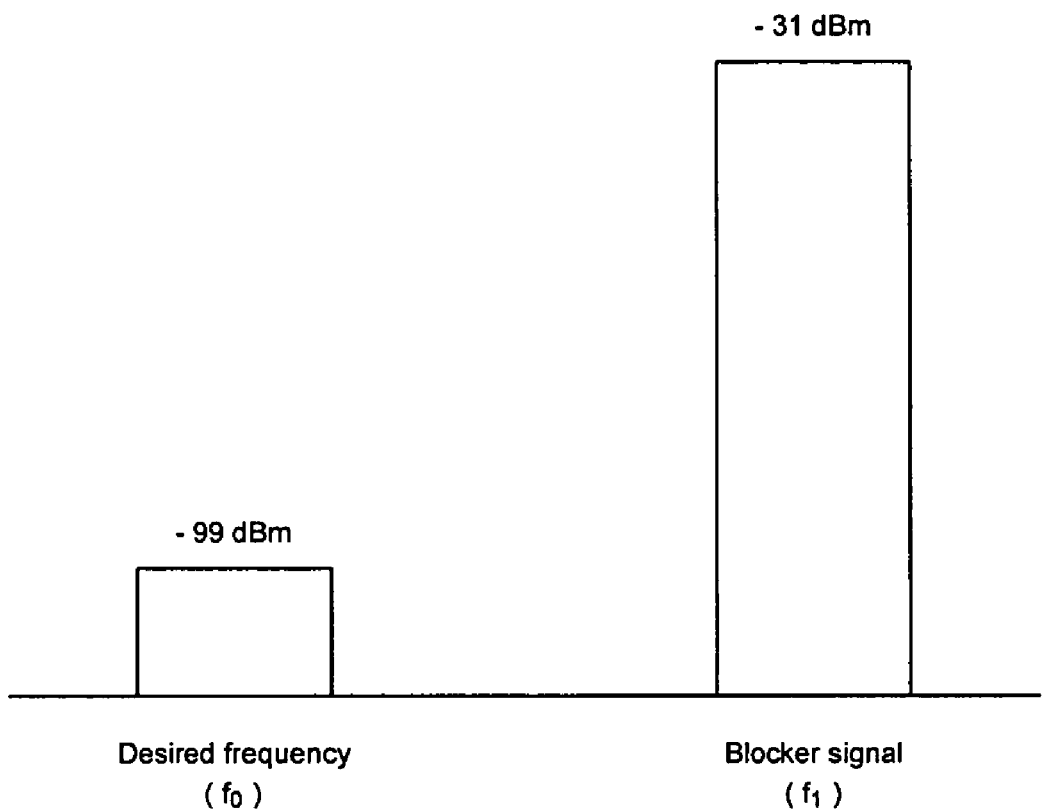
FIG. 1 illustrates an exemplary desired signal and an exemplary blocker signal within the passband of the channel of interest, in accordance with an embodiment of the invention.

FIG. 1 illustrates an exemplary desired signal and an exemplary blocker signal within the passband of the channel of interest, in accordance with an embodiment of the invention. Referring to FIG. 1, a desired signal at frequency $f_0$ and a blocker signal at frequency $f_1$ are shown. In the Global System for Mobile Communications (GSM) standard, for example, the frequency difference between the desired signal and the blocker signal may be expressed by $|f_1-f_0|>6$ MHz. The GSM standard also provides that, in some instances, the desired signal strength may be as low as −99 dBm while the blocker signal strength may be as high as −31 dBm. Since the blocker signal may be much larger than the desired signal, second order nonlinearities in an RF receiver may result in unwanted DC offset that may saturate the receive path and may also degrade the signal-to-noise ratio (SNR).

The receiver second order nonlinearities may be represented by the value of the second order input intercept point (IIP2). In GSM based applications the specified IIP2 may be +34 dBm, for example. The value specified for IIP2 may vary significantly according to application and/or system requirements. This value of IIP2 may be difficult to achieve given the specified ranges for the desired signal strength and blocker signal strength. The effects of second order nonlinearities in other communication standards may pose similar difficulties. For example, IIP2 value for the Personal Communication Service (PCS) standard may be +34 dBm, for PCS at an intermediate frequency (IF) of 108 KHz the specified IIP2 value may be +28 dBm, and for PCS at an IF of 108 KHz and 8 dB steps the specified IIP2 value may also be +28 dBm.

Figure 2:
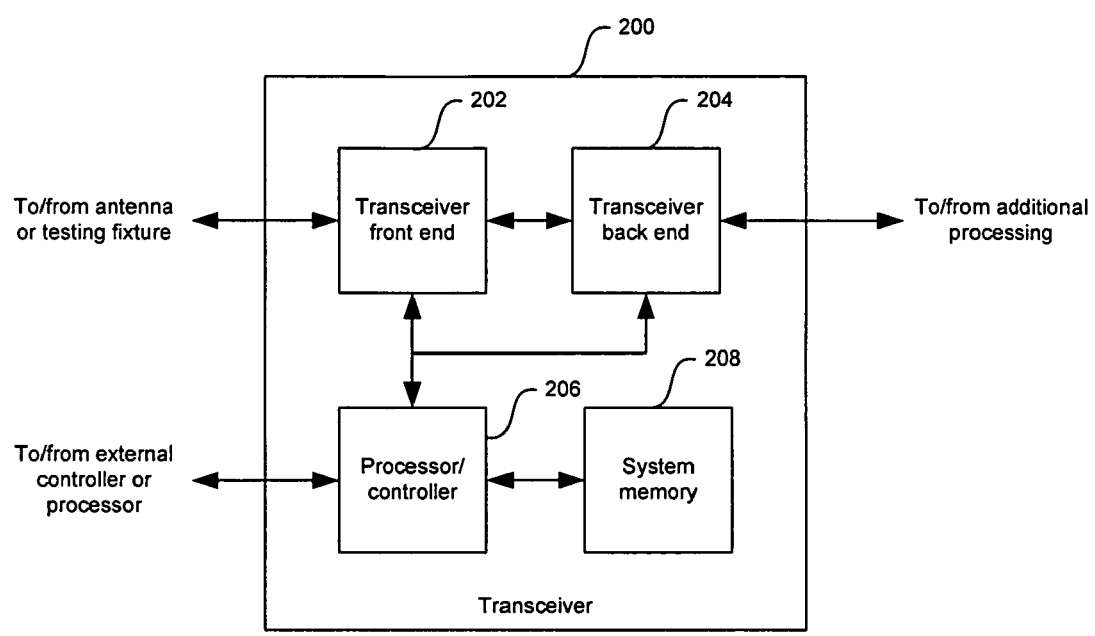
FIG. 2 is a block diagram of an exemplary RF transceiver system, in accordance with an embodiment of the invention.

FIG. 2 is a block diagram of an exemplary RF transceiver system, in accordance with an embodiment of the invention. Referring to FIG. 2, the RF transceiver system 200 may comprise a transceiver front end 202, a transceiver back end 204, a controller/processor 206, and a system memory 208. The transceiver front end 202 may comprise suitable logic, circuitry, and/or code that may be adapted to receive and/or transmit an RF signal. The transceiver front end 202 may comprise a receiver portion and a transmitter portion. Both the transmitter portion and the receiver portion may be coupled to an external antenna for signal broadcasting and signal reception respectively. The transceiver front end 202 may modulate a signal for transmission and may also demodulate a received signal before further processing of the received signal is to take place. Moreover, the transceiver front end 202 may provide other functions, for example, digital-to-analog conversion, analog-to-digital conversion, frequency downsampling, frequency upsampling, and/or filtering.

The transceiver back end 204 may comprise suitable logic, circuitry, and/or code that may be adapted to digitally process received signals from the transceiver front end 204 and/or to process signals received from at least one processing block, which may be located external to the RF transceiver system 200. The controller/processor 206 may comprise suitable logic, circuitry, and/or code that may be adapted to control the operations of the transceiver front end 202 and/or the transceiver back end 204. For example, the controller/processor 206 may be utilized to update and/or modify programmable parameters and/or values in a plurality of components, devices, and/or processing elements in the transceiver front end 202 and/or in the transceiver back end 204. Control and/or data information may be transferred from at least one controller and/or processor external to the RF transceiver system 200 to the controller/processor 206 during the operation of the RF transceiver system 200. Moreover, the controller/processor 206 may also transfer control and/or data information to at least one controller and/or processor external to the RF transceiver system 200.

The controller/processor 206 may utilize the received control and/or data information to determine the mode of operation of the transceiver front end 202. For example, the controller/processor 206 may select between an IIP2 production testing calibration scheme and an IIP2 field operation calibration scheme and may configure and operate the transceiver front end 202 accordingly. Moreover, IIP2 compensation currents determined during either IIP2 calibration scheme may be stored in the system memory 202 via the controller/processor 206. Stored IIP2 compensation currents may be transferred to the transceiver front end 202 from the system memory 208 via the controller/processor 206. The system memory 208 may comprise suitable logic, circuitry, and/or code that may be adapted to store a plurality of control and/or data information, including IIP2 compensation currents determined during either IIP2 calibration scheme.

Figure 3:
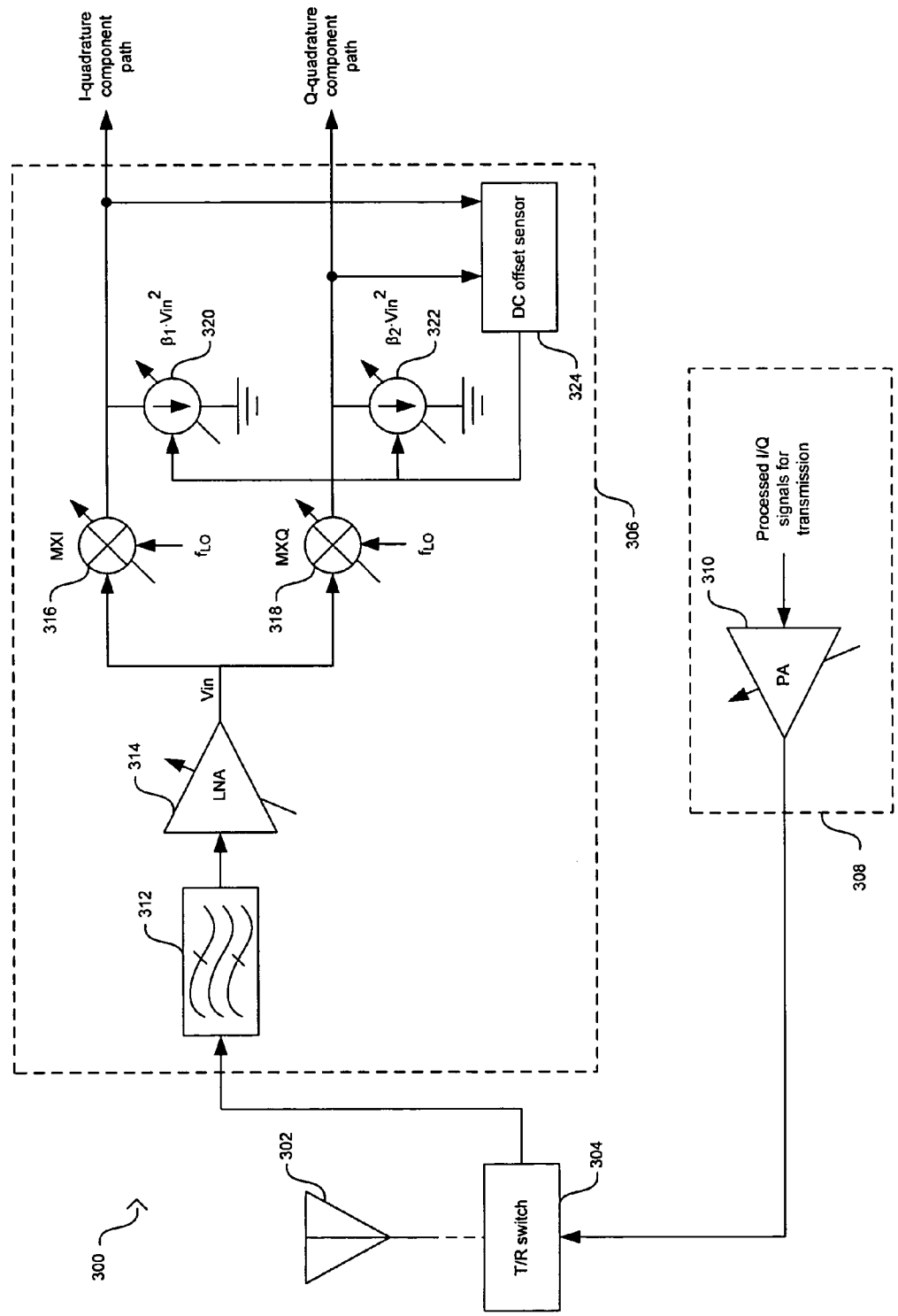
FIG. 3 is a block diagram that illustrates a receiver portion and a transmitter portion of an exemplary transceiver front end, in accordance with an embodiment of the invention.

FIG. 3 is a block diagram that illustrates a receiver portion and a transmitter portion of an exemplary transceiver front end, in accordance with an embodiment of the invention. Referring to FIG. 3, the transceiver front end 300 may comprise a transmit/receive (T/R) switch 304, a receiver portion 306, and a transmitter portion 310. The T/R switch 304 may comprise suitable logic, circuitry, and/or code that may be adapted to select between a transmit mode, in which signals may be transferred from the transceiver front end 300, and a receive mode, in which signals may be transferred from either an external antenna or a testing fixture, for example, to the transceiver front end 300. Whether the T/R switch 304 selects the transmit mode or the receive mode may be signaled by, for example, the controller/processor 206 in FIG. 2.

Regarding the receive mode of operation, FIG. 3 shows an antenna 302 coupled to the T/R switch 304 with a dashed line to indicate that the antenna 302 may be one of a plurality of elements, components, and/or devices that may be coupled to the T/R switch 304. For example, during IIP2 field operation calibration, the T/R switch 304 may be coupled to the antenna 302, while during IIP2 production testing calibration, the T/R switch 304 may be coupled to, for example, an external test fixture. Isolation between the receiver portion 306, the transmitter portion 308, and the external connection of the T/R switch 304 may not be perfect and, as a result, a certain amount of leakage may take place. For example, during the transmit mode of operation, a portion of the transmitted signal from the transmitter portion 308 may be leaked to the receiver portion 306.

The transmitter portion 310 may comprise a power amplifier (PA) 310 that amplifies an "I" (in-phase) signal component and/or a "Q" (quadrature) signal component before transferring either signal to the T/R switch 304 for transmission. Certain aspects of the PA 310 may be programmed by, for example, the controller/processor 206 in FIG. 2. One of these aspects may be the gain applied by the PA 310 to the "I" signal component and/or the "Q" signal component before transferring either signal to the T/R switch 304 for transmission. The output signal frequency from the PA 310 during IIP2 calibration may be given as $f_{LO}-26$ MHz, where $f_{LO}$ is a local oscillator frequency ($f_{LO}$) as utilized in the receiver portion 306. While FIG. 3 only shows the PA 310, the transmitter portion 310 may not be so limited and may also comprise additional logic, circuitry, and/or code that may be adapted to process the I/Q signal components before amplification by the PA 310.

The receiver portion 306 may comprise a bandpass filter 312, a low noise amplifier (LNA) 314, a "I" component mixer (MXI) 316, a "Q" component mixer (MXQ) 318, a first injection circuit 320, a second injection circuit 322, and a DC offset sensor 324. The receiver portion 306 may not be limited to the elements, components, and/or devices shown in FIG. 3 and may also comprise additional logic, circuitry, and/or code that may be adapted to further process the I/Q signal components. The bandpass filter 312 may comprise suitable logic, circuitry, and/or code that may be adapted to select signals in the bandpass of the channel of interest. The bandpass filter 312 may have a frequency band of 925 to 960 MHz, for example. The LNA 314 may comprise suitable logic, circuitry, and/or code that may be adapted amplify the output of the bandpass filter 312. Certain aspects of the LNA 314 may be programmed by, for example, the controller/processor 206 in FIG. 2. One of these aspects may be the gain applied by the LNA 314 to the output of the bandpass filter 312. In some instances, changing the gain in the LNA 314 to a mid-gain level may improve upon the receiver portion 306 IIP2 performance.

The MXI 316 may comprise suitable logic, circuitry, and/or code that may be adapted to mix the output of the LNA 314, Vin, with the local oscillator frequency ($f_{LO}$) to produce a zero intermediate frequency (IF) "I" signal component. The "I" signal component may be a differential signal, for example. Certain aspects of the MXI 316 may be programmed by, for example, the controller/processor 206 in FIG. 2. The MXQ 318 may comprise suitable logic, circuitry, and/or code that may be adapted to mix the output of the LNA 314, Vin, with a local oscillator frequency ($f_{LO}$) to produce a zero IF "Q" signal component. The Q" quadrature signal component may be a differential signal, for example. Certain aspects of the MXQ 318 may be programmed by, for example, the controller/processor 206 in FIG. 2. The IIP2 performance of the receiver portion 306 may be limited in part by the second order nonlinear characteristics of the MXI 316 and/or the MXQ 318. Moreover, a variable IF, for example, 100 KHz, 104 KHz, 108 KHz, or 112 KHz, may be utilized to trade between I/Q signal components matching and improving the receiver portion 306 IIP2 performance.

The first injection circuit 320 may comprise suitable logic, circuitry, and/or code that may be adapted to apply a first DC offset current that compensates for DC offset values produced on the "I" signal component by second order distortion in the receiver portion 306. The first DC offset current may be a current which may be expressed as $\beta_1 \cdot Vin^2$, where $\beta_1$ is a first proportionality parameter and Vin is the output of the LNA 314. The first proportionality parameter, $\beta_1$, may correspond to a complementary metal oxide semiconductor (CMOS) transconductance parameter representative of a portion of the transistors in the first injection circuit 320 that may be utilized to generate the first DC offset current. The applied current is proportional to $Vin^2$ to compensate for the second order nonlinearities of the receiver portion 306. The current applied by the first injection circuit 320 may be a differential current, for example. Certain aspects of the first injection circuit 320 may be programmable and may be programmed by, for example, the DC offset sensor 324. Some of these aspects may be the amplitude and polarity of the first DC offset current.

The second injection circuit 322 may comprise suitable logic, circuitry, and/or code that may be adapted to apply a second DC offset current that compensates for DC offset values produced on the "Q" signal component by second order distortion in the receiver portion 306. The second DC offset current may be a current which may be expressed as $\beta_2 \cdot Vin^2$, where $\beta_2$ is a second proportionality parameter and Vin is the output voltage of the LNA 314. The second proportionality parameter, $\beta_2$, may correspond to a CMOS transistor transconductance parameter representative of a portion of the transistors in the second injection circuit 322 that may be utilized to generate the first DC offset current. The applied current is proportional to $Vin^2$ to compensate for the second order nonlinearities of the receiver portion 306. The current applied by the second injection circuit 322 may be a differential current, for example. Certain aspects of the second injection circuit 322 may be programmable and may be programmed by, for example, the DC offset sensor 324 Some of these aspects may be the amplitude and polarity of the second DC offset current.

The DC offset sensor 324 may comprise suitable logic, circuitry, and/of code that may be adapted to sense or detect DC offset levels in the "I" signal component path and/or the "Q" signal component path in the receiver portion 306. The DC offset sensor 324 may generate a parameter that represents the first DC offset current and/or a parameter that represents the second DC offset current based on the sensing or detection of the "I" signal component path and/or the "Q" signal component path respectively. The DC offset current parameters may comprise information regarding the manner in which the injection circuits may generate the DC offset currents and/or information regarding the value of Vin. The DC offset sensor 324 may then transfer the first DC offset current parameter to the first injection circuit 320 and the second DC offset current parameter to the second injection circuit 322. Sensing by the DC offset sensor 324 may be performed at instances which may be determined based on a schedule or as instructed by, for example, the controller/processor 206 in FIG. 2. In some instances, the DC offset sensor 324 may comprise a local memory that may be adapted to store the DC offset current parameters after calibration. The DC offset sensor 324 may also transfer the DC offset current parameters to the system memory 208 in FIG. 2 for digital storage via the controller/processor 206, for example. The DC offset sensor 324 may also be utilized to determine variations in circuit performance based on temperature change, operational changes such as voltage variations, and variations in the process utilized during integrated circuit (IC) manufacturing.

Figure 4:
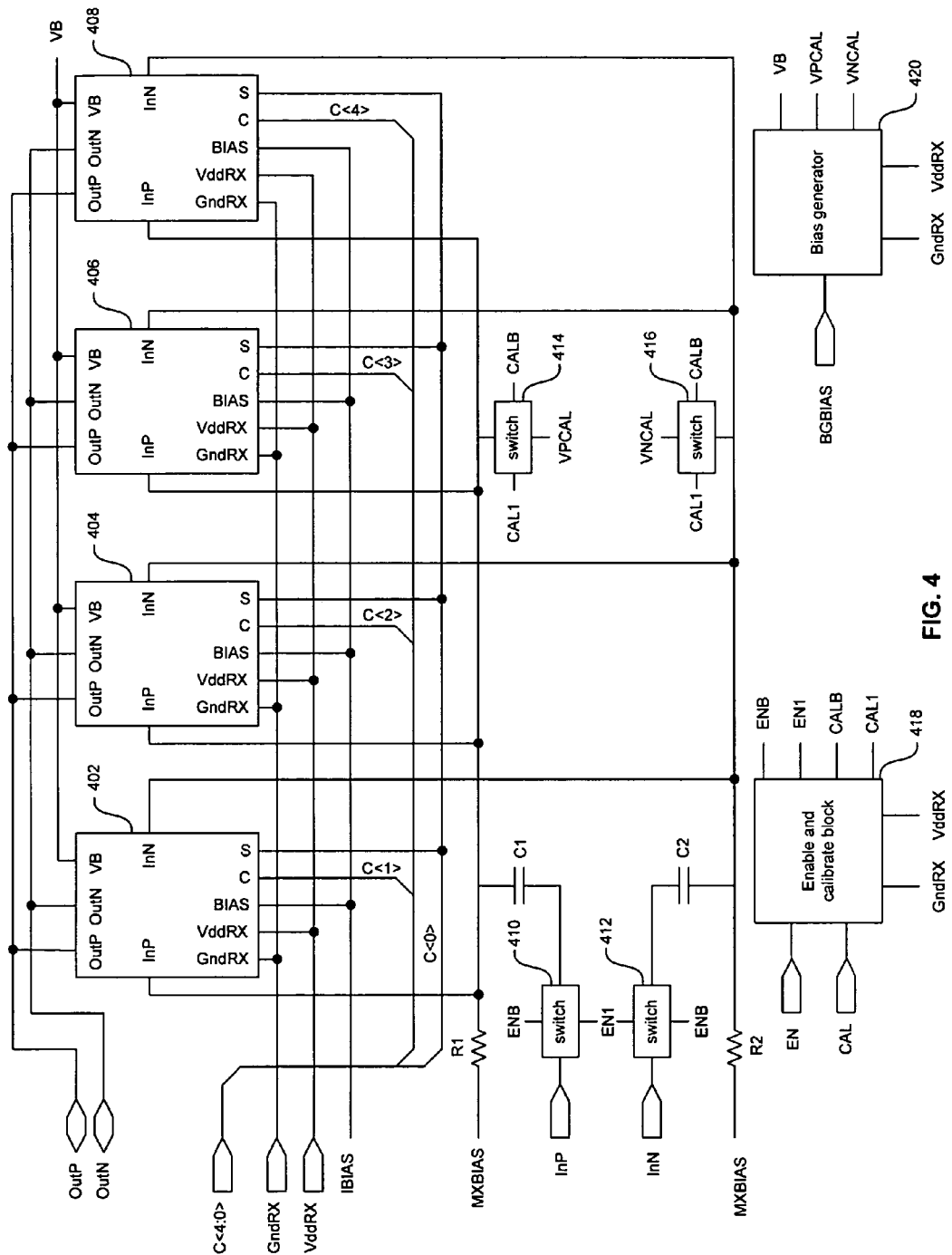
FIG. 4 is a block diagram of an exemplary injection circuit, in accordance with an embodiment of the invention.

FIG. 4 is a block diagram of an exemplary injection circuit, in accordance with an embodiment of the invention. Referring to FIG. 4, the injection circuits 320 and 322 in FIG. 3 may each comprise current drivers 402, 404, 406, and 408, a first switch 410, a second switch 412, a third switch 414, a fourth switch 416, an enable and calibrate block 418, and a bias generator block 420. While FIG. 4 illustrates four current drivers in an injection circuit, however, the invention may not be so limited and a plurality of current drivers may be utilized in an injection circuit in accordance with design specifications and in consideration of layout area and/or current resolution, for example.

The bias generator 420 may comprise suitable logic and/or circuitry that may be adapted to generate a plurality of voltages which may be utilized as reference levels in an injection circuit. The bias generator 420 may be based on a bandgap voltage reference circuit, for example. Notwithstanding, the bias generator 420 may utilize a bandgap bias (BGBIAS) signal as a basis from which at least one of the reference levels may be generated. The bias generator 420 may produce a voltage bias (VB) signal, a positive calibration voltage (VPCAL) signal, and a negative calibration voltage (VNCAL) signal, for example, where the VPCAL and VNCAL signals may correspond to a calibration voltage differential pair.

The enable and calibrate block 418 may comprise suitable logic and/or circuitry and may be adapted to generate a plurality of signals which may be utilized to configure the operation of an injection circuit. For example, when an injection circuit is utilized to generate a DC offset current, the enable and calibrate block 418 may generate, from a first enable (EN) signal, a second enable (EN1) signal and an inverted second enable (ENB) signal. The EN1 signal may be a buffered version of the EN signal, for example. The EN signal may be communicated or transferred to the enable and calibrate block 418 from the processor/controller 206 in FIG. 2, for example. The EN1 and ENB signals may be utilized to turn ON or OFF switches 410 and 412 during DC offset current generation by an injection circuit. When switches 410 and 412 are turned ON, and switches 414 and 416 are turned OFF, a positive input voltage (InP) signal and a negative input voltage (InN) signal may be transferred or communicated to the corresponding InP and InN ports in the current drivers

402, 404, 406, and 408. The InP and InN signals may correspond to the differential voltage signal Vin from the LNA 314 in FIG. 3, for example. The current drivers 402, 404, 406, and 408 may then utilize the InP/InN differential voltage signal to generate weighted offset currents which may be added to produce a DC offset current.

In another example, when correcting or adjusting the gain in the current drivers 402, 404, 406, and 408, the enable and calibrate block 418 may generate, from a first calibrate (CAL) signal, a second calibrate (CAL1) signal and an inverted second calibrate (CALB) signal. The CAL1 signal may be a buffered version of the CAL signal, for example. The CAL signal may be communicated or transferred to the enable and calibrate block 418 from the processor/controller 206 in FIG. 2, for example.

The CAL1 and CALB signals may be utilized to turn ON or OFF switches 414 and 416 during gain correction. When switches 414 and 416 are turned ON, and switches 410 and 412 are turned OFF, the VPCAL and VNCAL differential pair generated by the bias generator 420 may be transferred or communicated to the corresponding InP and InN ports in the current drivers 402, 404, 406, and 408. The current drivers 402, 404, 406, and 408 may then utilize the VPCAL/VNCAL differential voltage signal to generate weighted offset currents which may be added to produce a calibration DC offset current.

The switches 410, 412, 414, and 416 may comprise suitable logic and/or circuitry and may be adapted transfer a signal from an input port to an output port when the appropriate enabling signals are provided. For example, in the exemplary implementation shown in FIG. 4, when the EN1 signal is HIGH and the ENB signal is LOW, the switches 410 and 412 are both turned ON and the InP and InN differential voltage signal may be transferred to the current drivers 402, 404, 406, and 408 via capacitors C1 and C2. In this regard, capacitors C1 and C2 may provide AC coupling from the switches 410 and 412 to the current drivers. Resistors R1 and R2 may represent mixer output loads. In another exemplary implementation, when the EN1 signal is LOW and the ENB signal is HIGH, the switches 410 and 412 are both turned ON and the InP and InN differential voltage signal may be transferred to the current drivers 402, 404, 406, and 408 via capacitors C1 and C2. In either of these implementations, the switches 414 and 416 may both be turned OFF by the CAL1 and CALB signals.

In the exemplary implementation shown in FIG. 4, when the CAL1 signal is HIGH and the CALB signal is LOW, the switches 414 and 416 are both turned ON and the VPCAL and VNCAL differential voltage signal may be transferred to the current drivers 402, 404, 406, and 408 via capacitors C1 and C2. In another exemplary implementation, when the CAL1 signal is LOW and the CALB signal is HIGH, the switches 414 and 416 are both turned ON and the VPCAL and VNCAL differential voltage signal may be transferred to the current drivers 402, 404, 406, and 408 via capacitors C1 and C2. In either of these implementations, the switches 410 and 412 are both turned OFF by the EN1 and ENB signals.

The current drivers 402, 404, 406, and 408 may comprise suitable logic and/or circuitry that may be adapted to generate weighted offset currents, where the weighted offset currents may be differential current signals. The positive output current (OutP) signal and the negative output current (OutN) signal in FIG. 4 may represent the differential nature of the weighted offset currents. The weighted offset currents may be added to produce either a DC offset current or a calibration DC offset current, in accordance with the configuration of the injection circuit. For example, the addition of the weighted offset currents produced by the current drivers may generate a DC offset current when the injection circuit is configured so that the InP/InN differential voltage signal is communicated or transferred to the InP and InN ports of the current drivers. In another example, the addition of the weighted offset currents produced by the current drivers may generate a calibration DC offset current when the injection circuit is configured so that the VPCAL/VNCAL differential voltage signal is communicated or transferred to the InP and InN ports of the current drivers.

The weighted offset currents produced by the current drivers 402, 404, 406, and 408 may be binary weighted and may have positive or negative polarity or sign. In an exemplary implementation of a binary weighted set of weighted offset currents, the current driver 402 may produce a 1 µA amplitude weighted offset current, the current driver 404 may produce a 2 µA amplitude weighted offset current, the current driver 406 may produce a 4 µA amplitude weighted offset current, and the current driver 408 may produce an 8 µA amplitude weighted offset current. To generate a DC offset current in the injection circuit of +7 µA, for example, the current drivers 402, 404, and 406 may be selected and the current driver 408 may not be selected. Moreover, a positive polarity output may be selected for each of the current drivers.

A plurality of current driver control signals may be utilized to select the current drivers for generating the weighted offset current to produce a DC offset current and also to select the polarity or sign of the DC offset current to be generated. The current driver control signals as shown in FIG. 4 may comprise a polarity selection signal, C<0>, a plurality of current driver selection signals, C<1:4>, and a current bias signal, IBIAS. In this exemplary implementation, the polarity selection signal C<0> may be transferred or communicated to all current drivers via an S port. The current driver selection signals C<1:4>, each representing one of the current drivers in the injection circuit, may be transferred or communicated to a corresponding current driver via a C port, for example. Moreover, the current bias signal IBIAS may be transferred or communicated to all current drivers via a BIAS port, for example.

In operation, the processor/controller 206 in FIG. 2 may transfer or communicate the EN and CAL signals to the injection circuits 320 and 322, for example. The BGBIAS, IBIAS, receiver ground (GndRX) signal, and receiver supply (VddRX) signals may be transferred or communicated to the injection circuits 320 and 322 from other portions of the transceiver 200 in FIG. 2. The current driver control signals and/or the InP/InN differential voltage signal may be transferred or communicated to the injection circuits 320 and 322 from the DC offset sensor 324, for example.

The enable and calibrate block 418 may generate the EN1, ENB, CAL1, and CALB signals to select whether the InP/InN differential voltage signal or the VPCAL/VNCAL differential voltage signal may be transferred or communicated to the current drivers 402, 404, 406, and 408. The current drivers 402, 404, 406, and 408 may generate weighted offset currents in accordance with the current driver control signals, that is, the weighted offset currents may produce a DC offset current of the appropriate amplitude and polarity. The generated weighted offset currents in the injection circuit 320 may be added to produce DC offset current that may compensate for the DC offset produced in the "I" signal component path. Similarly, the generated weighted offset currents in the injection circuit 322 may be added to produce DC offset current that may compensate for the DC offset produced in the "Q" signal component path.

Figure 5:
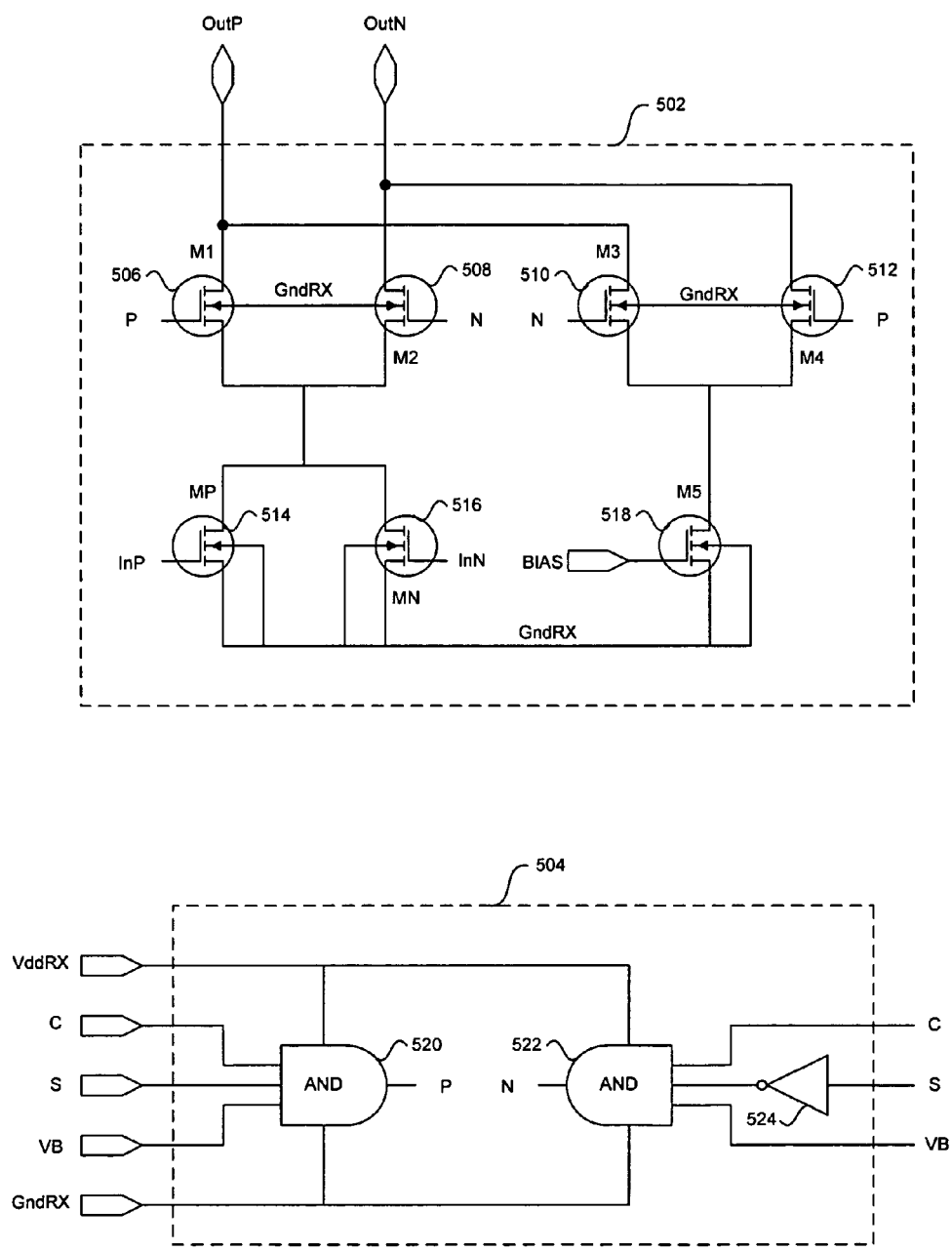
FIG. 5 is a block diagram of an exemplary current driver circuit, in accordance with an embodiment of the invention.

FIG. 5 is a block diagram of an exemplary current driver circuit, in accordance with an embodiment of the invention. Referring to FIG. 5, a current driver may comprise a current generator 502 and a polarity controller 504. The polarity controller 504 may comprise suitable logic and/or circuitry that may be adapted to generate a positive polarity signal and a negative polarity signal. In the exemplary implementation shown in FIG. 5, the polarity controller 504 may comprise a first AND gate 520, a second AND gate 522, and an inverter 524 gate. The first AND gate 520 may generate the positive polarity signal by ANDing the current driver selection signal and the polarity selection signal. In another exemplary implementation, the first AND gate 520 may generate the positive polarity signal by ANDing the current driver selection signal, the polarity selection signal, and the VB signal. The second AND gate 520 may generate the negative polarity signal by ANDing the current driver selection signal and an inverted polarity selection signal produced by the inverter 524. In another exemplary implementation, the second AND gate 522 may generate the negative polarity signal by ANDing the current driver selection signal, the inverted polarity selection signal, and the VB signal.

The current generator 502 may comprise a first NMOS transistor (M1) 506, a second NMOS transistor (M2) 508, a third NMOS transistor (M3) 510, a fourth NMOS transistor (M4) 512, a fifth NMOS transistor (M5) 518, a sixth NMOS transistor (MP) 514, and a seventh NMOS transistor (MN) 516. The MP 514, MN 516, and M5 518 transistors may be long channel transistors, where the channel length may be determined by design requirements such as differential linearity, for example. The exemplary implementation shown in FIG. 5 may not be limited to designs based on NMOS transistors, other types of designs, for example, PMOS and/or CMOS-based designs, may be utilized.

The current in the long channel transistors MP 514 and MN 516 may be expressed as $I = \frac{1}{2} \cdot \beta \cdot (V - V_{TH})^2$, where $\beta$ is the transconductance parameter, V is the gate-to-source voltage, and $V_{TH}$ is the transistor threshold voltage. The transconductance parameter may be expressed by $\beta = \mu \cdot C_{OX} \cdot (W/L)$, where $\mu$ is the carrier mobility, $C_{OX}$ is the gate oxide capacitance, W is the transistor width, and L is the transistor length. The values for the carrier mobility, $\mu$, and the gate oxide capacitance, $C_{OX}$, may depend on the manufacturing process and/or the temperature of operation. The value of the transconductance $\beta$ may be the same for transistors MP 514 and MN 516. The voltage in the InP and InN ports may be expressed by $V(InP) = V_{DC} + A \cdot \sin(\omega_0 t)$ and $V(InN) = V_{DC} - A \cdot \sin(\omega_0 t)$ respectively, where $V_{DC}$ is a DC voltage, A is the amplitude of the time varying signal, and $\omega_0$ is the angular frequency of the time varying signal. The total current produced by the MP 514 and MN 516 transistor pair may be expressed by $I_{MP} + I_{MN} = \frac{1}{2} \cdot \beta \cdot (V_{DC} + A \cdot \sin(\omega_0 t) - V_{TH})^2 + \frac{1}{2} \cdot \beta \cdot (V_{DC} - A \cdot \sin(\omega_0 t) - V_{TH})^2 = \frac{1}{2} \cdot (2 \cdot \beta \cdot (V_{DC} - V_{TH})^2 + \beta \cdot A^2 \cdot \sin(2\omega_0 t))$, and may be approximated by $I_{MP} + I_{MN} \approx \beta \cdot (V_{DC} - V_{TH})^2 + \frac{1}{2} \cdot \beta \cdot A^2$.

The IBIAS signal may be selected so that the current in the transistor M5 518 may be expressed by $I_{M5} = \beta_{M5} \cdot (V_{DC} - V_{TH})^2$, where $I_{M5}$ is a reference current in the current driver. The value of $\beta_{M5}$ for transistor M5 518 may be the same as the value of $\beta$ for transistors MP 514 and MN 516. The amplitude of the OutP/OutN differential current signal from a current driver may be expressed by $(I_{MP} + I_{MN}) - I_{M5} = \frac{1}{2} \cdot \beta \cdot A^2$. The value $\beta \cdot A^2$ may correspond to a portion of the first DC offset current, $\beta_1 \cdot Vin^2$, in the injection circuit 320, for example. In this regard, the transconductance parameter P in each of the current drivers 402, 404, 406, and 408 may be binary weighted to produce the appropriate DC offset current. For example, for a given value of W and L, the transconductance parameter for transistors MP 514, MN 516, and M5 518 in the current driver 402 may be $\beta = \mu \cdot C_{OX} \cdot (W/L)$, for current driver 404 may be $\beta = \mu \cdot C_{OX} \cdot (2 \cdot W/L)$, for current driver 406 may be $\beta = \mu \cdot C_{OX} \cdot (4 \cdot W/L)$, and for the current driver 408 may be $\beta = \mu \cdot C_{OX} \cdot (8 \cdot W/L)$.

During gain correction or adjustment in which the switches 414 and 416 are turned on ON, the effective value of $\beta$ for an injection circuit may be determined from $\beta = 2 \cdot I_{DC}/A^2$, where A is known from the VPCAL/VNCAL differential voltage signal utilized for calibration and $I_{DC}$ is the DC offset current produced by the injection circuit for a given current driver control signal. The effective value of $\beta$ may be further modified by considering the DC offset that may result from mismatches between the transistors MP 514, MN 516, and M5 518.

In operation, when both the current driver selection signal and the polarity selection signal are HIGH, the polarity controller 504 may generate a HIGH positive polarity signal and a LOW negative polarity signal, for example. When the current driver selection signal is HIGH and the polarity selection signal is LOW, the polarity controller 504 may generate a LOW positive polarity signal and a HIGH negative polarity. When the current driver selection signal is LOW, the current driver is not selected and both the positive and negative polarity signals are LOW.

In the exemplary implementation shown in FIG. 5, when the positive polarity signal is HIGH and the negative polarity signal is LOW, the transistors M1 506 and M4 512 are ON and the transistors M2 508 and M3 510 are OFF. In this case, the $I_{MP} + I_{MN}$ current goes to the OutP port and the $I_{M5}$ current goes to the OutN port to produce a weighted offset current of positive polarity and an amplitude of $abs[(I_{MP} + I_{MN}) - I_{M5}]$, where the function abs[ ] is an absolute value function. When the positive polarity signal is LOW and the negative polarity signal is HIGH, the transistors M1 506 and M4 512 are OFF and the transistors M2 508 and M3 510 are ON. In this case, the $I_{MP} + I_{MN}$ current goes to the OutN port and the $I_{M5}$ current goes to the OutP port to produce a weighted offset current of negative polarity and an amplitude of $abs[(I_{MP} + I_{MN}) - I_{M5}]$. When the current driver is not selected, transistors M1 506, M2 508, M3 510, and M4 512 are OFF and no current is generated at ports OutP and OutN in the current driver.

Figure 6:
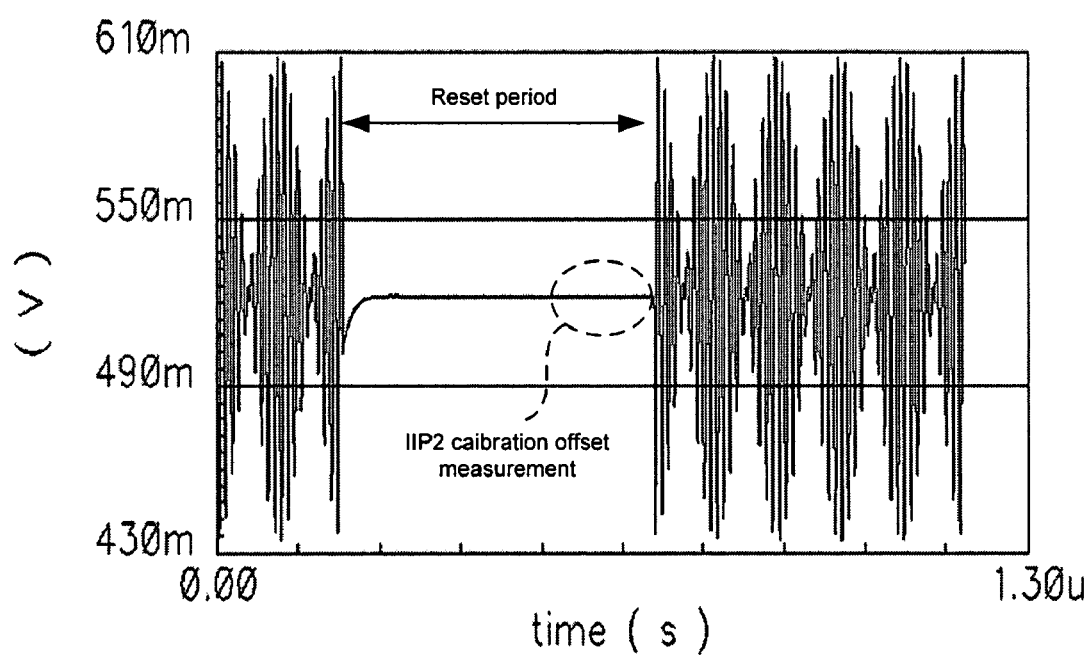
FIG. 6 illustrates an exemplary recording of mismatch DC offset during a reset operation, in accordance with an embodiment of the invention.

FIG. 6 illustrates an exemplary recording of mismatch DC offset during a reset operation, in accordance with an embodiment of the invention. Regarding FIG. 6, a reset period may be utilized to record the DC offset that may result from mismatches in the MP 514, MN 516, and M5 518 transistors. During the reset period, the switches 410 and 412 are OFF. The reset period may require a settling time of less than 1 μsec, for example. Once the appropriate signal component voltage path has settled, a DC offset may be measured and recorded by the DC offset sensor 324 in FIG. 3. The voltage settling time and the recording time may vary according to design requirements, process, temperature, and other operational conditions, for example.

Figure 7:
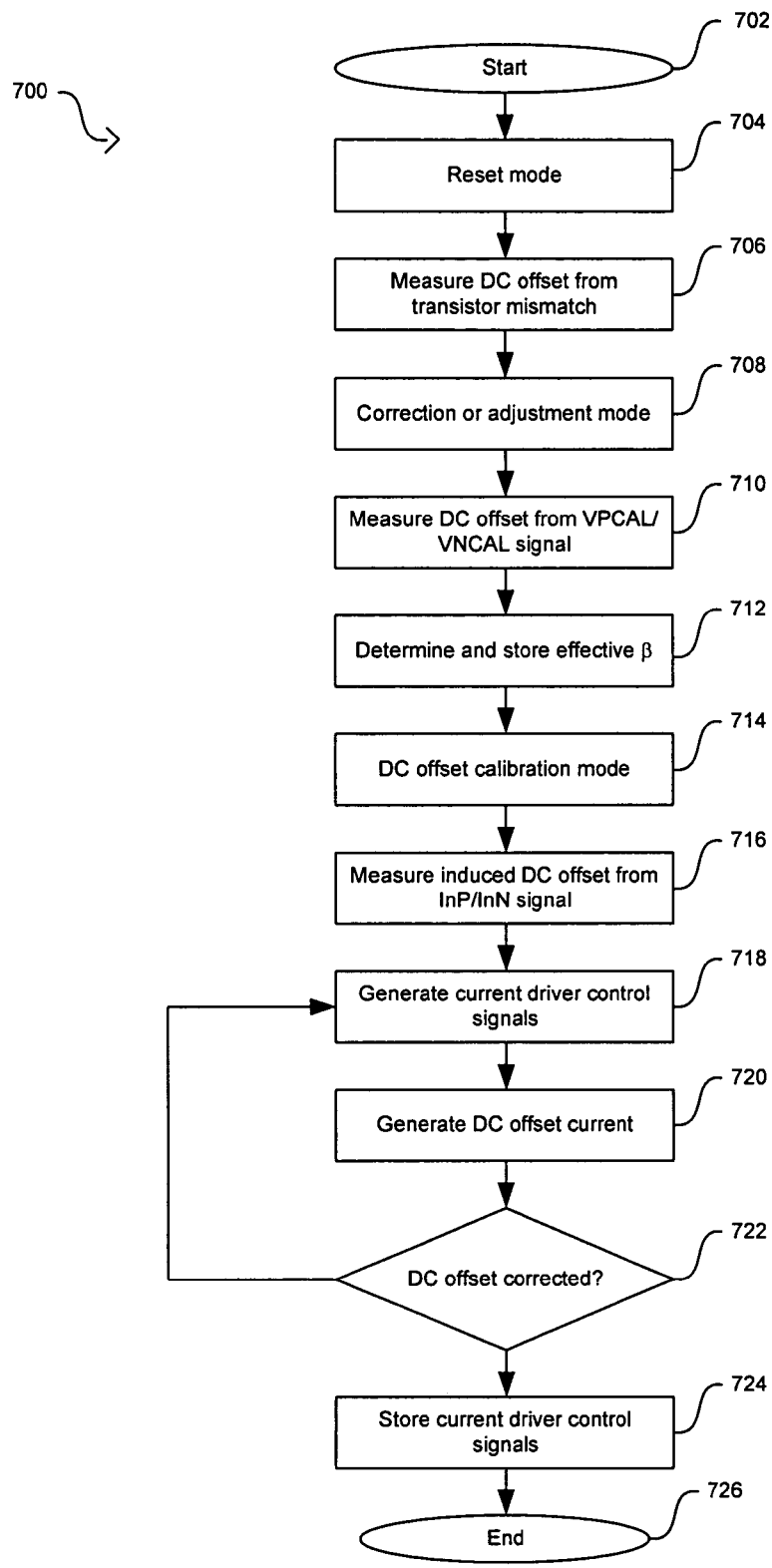
FIG. 7 is a flow diagram illustrating exemplary steps during IIP2 calibration and correction, in accordance with an embodiment of the invention.

FIG. 7 is a flow diagram illustrating exemplary steps during IIP2 calibration and correction, in accordance with an embodiment of the invention. Referring to FIG. 7, at least a portion of the exemplary transceiver front end 300 in FIG. 3 may be placed in a reset mode in step 704. In step 706, the DC offset sensor 324 may measure a DC offset voltage in the "I" and "Q" signal component paths that may result from transistor mismatches in the injection circuit current drivers. The DC offset sensor 324 may store the DC offset voltage and may utilize it to modify and/or update the effective transconductance $\beta_1$ in the injection circuit 320 and the effective transconductance $\beta_2$ in the injection circuit 322.

In step 708, a correction or adjustment mode of operation may be performed by turning on the switches 414 and 416 and by transferring or communicating the VPCAL/VNCAL differential voltage signal to the current drivers 402, 404, 406 and 408 in the injection circuits. In step 710, the calibration DC offset voltage that may result from the calibration DC offset current may be measured by the DC offset sensor 324. In step 712, the effective transconductance $\beta_1$ in the injection circuit 320 and the effective transconductance $\beta_2$ in the injection circuit 322 may be determined from the known value of the VPCAL/VNCAL differential voltage signal and the corresponding current driver control signal. The values of $\beta_1$ and $\beta_2$ may be modified based on the mismatch information gathered in step 706. The values of $\beta_1$ and $\beta_2$ may be stored in, for example, the system memory 208 in FIG. 2 and may be utilized for IIP2 calibration during the operation of the transceiver 200.

In step 714, a DC offset calibration mode may be performed by turning ON the switches 410 and 412 and by transferring or communicating the InP/InN differential voltage signal to the current drivers 402, 404, 406 and 408 in the injection circuits. The InP/InN differential voltage signal may correspond to the injected blocker signal in the receiver portion 306 of the transceiver front end 300. In step 716, the DC offset sensor 324 may measure the induced DC offset voltage in the "I" and/or "Q" signal component paths that may result from the injected blocker signal. In step 718, the DC offset sensor 324 may generate corresponding current driver control signals for the injection circuit 320 and the injection circuit 322. In step 720, the injection circuit 320 and the injection circuit 322 may generate DC offset currents of the appropriate amplitude and polarity in accordance with the information provided by the current driver control signals.

In step 722, the DC offset sensor 324 may determine whether the induced DC offset voltages have been corrected by the application of the DC offset currents. When the induced DC offset voltages have not been corrected by the application of the DC offset currents, the flow diagram 700 may return to step 716 where a portion of induced DC offset voltage that remains after correction may be measured and a next set of current driver control signals may be generated in step 718. When the induced DC offset voltage has been corrected by the application of the DC offset currents, the flow diagram 700 may proceed to step 724 where the current driver control signals may be stored. The current driver control signals may be stored in the system memory 208 in FIG. 2, for example. After storing the current driver control signals in step 724, the flow diagram 700 may proceed to end step 726.

The approach described above may provide a flexible and cost effective way to correct any signal saturation and/or noticeable degradation in an RF receiver's noise performance that may result from the DC offset voltages produced by the presence of interfering signals in the channel of interest.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for a wireless receiver signal processing, the method comprising:
   detecting a DC offset voltage;
   generating a plurality of current driver control signals based on said detected DC offset voltage, wherein said generated plurality of current driver control signals comprise a polarity selection signal, a plurality of current driver selection signals, and a current bias signal;
   generating a plurality of weighted offset currents based on said generated plurality of current driver control signals and an input voltage; and
   generating a DC offset current to compensate for said detected DC offset voltage, wherein said DC offset current is based on said generated plurality of weighted offset currents.

2. The method according to claim 1, comprising selecting a number of current drivers to generate said plurality of weighted offset currents based on said plurality of current driver selection signals.

3. The method according to claim 1, comprising selecting a polarity for said plurality of weighted offset currents based on said polarity selection signal.

4. The method according to claim 1, comprising generating a reference current based on said current bias signal.

5. The method according to claim 1, comprising generating a positive polarity control signal in said plurality of current drivers by ANDing said polarity selection signal and a portion of said plurality of current driver selection signals that corresponds to each of said plurality of current drivers.

6. The method according to claim 1, comprising generating a negative polarity control signal in said plurality of current drivers by inverting said polarity selection signal and ANDing said inverted polarity selection signal and a portion of said plurality of current driver selection signals that corresponds to each of said plurality of current drivers.

7. A system for a wireless receiver signal processing, the system comprising:
   a DC offset sensor that detects a DC offset voltage;
   said DC offset sensor generates a plurality of current driver control signals based on said detected DC offset voltage, wherein said generated plurality of current driver control signals comprise a polarity selection signal, a plurality of current driver selection signals, and a current bias signal;
   a circuit comprising a plurality of current drivers;

said DC offset sensor transfers said generated plurality of current driver control signals and an input voltage to said plurality of current drivers in said circuit;

said plurality of current drivers generate a plurality of weighted offset currents in said circuit based on said transferred generated plurality of current driver control signals and said transferred input voltage; and said circuit generates a DC offset current to compensate for said detected DC offset voltage, wherein said DC offset current is based on said generated plurality of weighted offset currents.

8. The system according to claim 7, wherein said circuit selects a number of current drivers from said plurality of current drivers to generate said DC offset current based on said plurality of current driver selection signals.

9. The system according to claim 7, wherein said circuit selects a polarity for said plurality of weighted offset currents in said plurality of current drivers based on said polarity selection signal.

10. The system according to claim 7, wherein said plurality of current drivers generate a reference current based on said current bias signal.

11. The system according to claim 7, wherein said plurality of current drivers generate a positive polarity control signal by ANDing said polarity selection signal and a portion of said plurality of current driver selection signals that corresponds to each of said plurality of current drivers.

12. The system according to claim 7, wherein said plurality of current drivers generate a negative polarity control signal by inverting said polarity selection signal and ANDing said inverted polarity selection signal and a portion of said plurality of current driver selection signals that corresponds to each of said plurality of current drivers.

13. A system for a wireless receiver signal processing, the system comprising:

a DC offset sensor that detects a DC offset voltage;

said DC offset sensor generates a plurality of current driver control signals based on said detected DC offset voltage;

a circuit comprising a plurality of current drivers, wherein an injection circuit selects said input voltage by turning ON a third switch and a fourth switch and turning OFF a first switch and a second switch in said circuit and where said selected input voltage corresponds to a calibration signal;

said DC offset sensor transfers said generated plurality of current driver control signals and an input voltage to said plurality of current drivers in said circuit;

said plurality of current drivers generate a plurality of weighted offset currents in said circuit based on said transferred generated plurality of current driver control signals and said transferred input voltage; and said circuit generates a DC offset current to compensate for said detected DC offset voltage, wherein said DC offset current is based on said generated plurality of weighted offset currents.

14. The system according to claim 13, wherein said circuit generates a calibration DC offset current based on said calibration signal.

15. The system according to claim 14, wherein said DC offset sensor detects a calibration DC offset voltage produced by said generated calibration DC offset current.

16. The system according to claim 15, wherein said DC offset sensor stores said detected calibration DC offset voltage.

* * * * *